(12) United States Patent
Ma

(10) Patent No.: US 9,905,675 B1
(45) Date of Patent: Feb. 27, 2018

(54) GATE AND FIELD ELECTRODE TRENCH FORMATION PROCESS

(71) Applicant: Infineon Technologies Americas Corp., El Segundo, CA (US)

(72) Inventor: Ling Ma, Redondo Beach (CA)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/387,739

(22) Filed: Dec. 22, 2016

(51) Int. Cl.
*H01L 21/336* (2006.01)
*H01L 29/66* (2006.01)
*H01L 29/40* (2006.01)
*H01L 21/306* (2006.01)

(52) U.S. Cl.
CPC .. *H01L 29/66666* (2013.01); *H01L 21/30625* (2013.01); *H01L 29/407* (2013.01); *H01L 29/66734* (2013.01)

(58) Field of Classification Search
CPC ............ H01L 21/30625; H01L 29/407; H01L 29/66666; H01L 29/66734
See application file for complete search history.

(56) References Cited

U.S. PATENT DOCUMENTS

| 7,309,626 B2 | 12/2007 | Ieong et al. |
| 7,449,354 B2 | 11/2008 | Marchant et al. |
| 7,767,526 B1 | 8/2010 | Lee et al. |
| 8,247,865 B2 * | 8/2012 | Hirler ................... H01L 29/407 257/329 |
| 9,443,973 B2 | 9/2016 | Jin et al. |
| 2005/0191794 A1 | 9/2005 | Herrick et al. |

OTHER PUBLICATIONS

Saxena, Raghavendra S. et al., "Trench Gate Power MOSFET: Recent Advances and Innovations", Advances in Microelectronics and Photonics, (Ed., S. Jit), Chapter 1, Nova Science Publishers, Inc., Oct. 1, 2011, pp. 1-23.

* cited by examiner

*Primary Examiner* — Daniel Shook
(74) *Attorney, Agent, or Firm* — Murphy, Bilak & Homiller, PLLC

(57) ABSTRACT

An upper portion of a field electrode trench and a gate trench are simultaneously formed in the main surface of a substrate to approximately the same depth. A first protective layer is formed that completely fills the gate trench and lines the upper field electrode trench. The first protective layer is removed from the bottom of the upper trench and semiconductor material is removed thereby forming a lower portion of the field electrode trench while the gate trench remains completely filled by the first protective layer. An electrically conductive field electrode and a field electrode dielectric are formed in the field electrode trench. At least some of the first protective layer is removed from the gate trench. A conformal gate dielectric layer is formed on the substrate. An electrically conductive gate electrode is formed in the gate trench while the field electrode remains covered by the gate dielectric layer.

20 Claims, 19 Drawing Sheets

GATE AND FIELD ELECTRODE TRENCH FORMATION PROCESS

TECHNICAL FIELD

The instant application relates to semiconductor device formation and in particular relates to trenched gate power semiconductor device formation.

BACKGROUND

Semiconductor transistors, in particular field-effect controlled switching devices such as Metal Oxide Semiconductor Field Effect Transistors (MOSFET) and Insulated Gate Bipolar Transistors (IGBT) have been used in a wide variety of applications such as power supplies, power converters, electric cars and air-conditioners. Many of these applications are high power applications, which require the transistors to be able to accommodate substantial current and/or voltage, e.g., voltages in the range of 200V, 400V, 600V or more. In high power applications, two device parameters that play a substantial role in overall performance of the device are on-state resistance ($R_{ON}$) and breakdown voltage ($V_{BR}$). Lower on-state resistance $R_{ON}$ is a desirable characteristic because it minimizes the resistive power loss and corresponding heat generation that occurs when the device is in a forward conducting state. Meanwhile, high breakdown voltage $V_{BR}$ is a desirable characteristic because it determines how much voltage the device can safely block in an OFF state.

Power transistors typically include a lightly doped drift region between the output regions (e.g., source/drain regions) that substantially determines the breakdown voltage of the device. In the case of a vertical switching device (i.e., a device that is configured to conduct between opposite facing main and rear surfaces of the substrate), the drift region occupies most of the thickness of the substrate. The properties of the drift region can be tailored to achieve a desired tradeoff between on-state resistance and breakdown voltage. For example, by reducing the doping concentration of the drift region, the breakdown voltage the device can be improved. However, this comes at the expense of increased on-state resistance $R_{ON}$. Conversely, the doping concentration of the drift region can be increased to lower the on-state resistance at the expense of a reduced breakdown voltage $V_{BR}$.

Field electrodes are used in power switching devices to favorably shift the tradeoff between on-state resistance and breakdown voltage. Field electrodes utilize the compensation principle to balance charges during operation of the device. By tying the field electrode to a fixed potential (e.g., source potential) during the OFF state of the device, charges in the drift region are compensated for by corresponding charges in the field electrode. This charge balancing technique makes the device less susceptible to avalanche breakdown than would otherwise be the case in the absence of a field electrode. As a result the doping concentration of the drift region can be increased, and thus the on-state resistance of the device reduced, without detrimentally impacting the voltage blocking capability of the device.

In one power semiconductor device configuration, field electrodes are provided in so-called "needle trenches." An example of a needle-trench-configured device can be found in U.S. Pat. No. 8,247,865 to Hirler, which is incorporated herein by reference in its entirety. In general, "needle trench" style devices are vertical trenched-gate devices in which the trenches that contain the field electrode have a circular shape (from a plan-view perspective of the substrate) and are disposed at regular intervals along the length of the gate trenches. One advantage of these "needle trench" devices is improved scalability, i.e., miniaturization, in comparison to other trench designs. However, current techniques for forming the needle trenches introduce require many processing steps, which introduces additional time and expense into to the fabrication process.

SUMMARY

A method of forming a semiconductor device is disclosed. According to an embodiment of the method, a semiconductor substrate having a main surface is provided. An upper portion of a field electrode trench and a gate trench are simultaneously formed in the main surface of the substrate to approximately the same depth. A first protective layer is formed on the substrate. The first protective layer completely fills the gate trench and lines sidewalls of the upper portion of the field electrode trench. A bottom of the upper portion of the field electrode trench is exposed from the first protective layer. Semiconductor material is removed from the exposed bottom of the upper portion of the field electrode trench thereby forming a lower portion of the field electrode trench while the gate trench remains completely filled by the first protective layer. An electrically conductive field electrode and a field electrode dielectric are formed in the upper and lower portions of the field electrode trench while the gate trench remains completely filled by the first protective layer. At least some of the first protective layer is removed from the gate trench. A conformal gate dielectric layer that covers the field electrode and lines sidewalls of the gate trench is formed after removing the at least some of the first protective layer. An electrically conductive gate electrode is formed in the gate trench while the field electrode remains covered by the gate dielectric layer.

According to another embodiment of the method, a semiconductor substrate having a main surface is provided. A field electrode trench including a dielectrically insulated field electrode and a gate trench including a dielectrically insulated gate electrode are formed in the substrate. The field electrode trench is wider and deeper than the gate trench. The gate trench is longer than the field electrode trench. Forming the field electrode trench including the dielectrically insulated field electrode and the gate trench including the dielectrically insulated gate electrode includes forming an upper portion of the field electrode trench and the gate trench simultaneously, forming a first protective layer that completely fills the gate trench, and removing semiconductor material from a bottom of the upper portion of the field electrode trench thereby forming a lower portion of the field electrode trench while the gate trench remains completely filled by the first protective layer. Forming the field electrode trench including the dielectrically insulated field electrode and the gate trench including the dielectrically insulated gate electrode further includes removing at least some of the first protective layer from the gate trench, covering the field electrode with a second protective layer, forming an electrically conductive gate electrode and a gate trench dielectric in the gate trench while the field electrode remains covered by the second protective layer, forming an electrically conductive field electrode and a field electrode dielectric in the upper and lower portions of the field electrode trench while the gate trench remains completely filled by the first protective layer, removing at least some of the first protective layer from the gate trench, covering the field electrode with a second protective layer, and forming an electrically conductive gate electrode and a gate trench dielectric in the gate trench while the field electrode remains covered by the second protective layer.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein include a method for forming a gate trench and a field electrode trench using common lithography steps. According to the method, the gate trench and an upper portion of the field electrode trench are formed simultaneously using a single photomask. Subsequently, the gate trench is filled with a protective material, such as an oxide. Subsequently, the field electrode trench is deepened using an etching process, for example. Subsequently, a field electrode trench dielectric and a field electrode are formed in the field electrode trench. The presence of the protective layer in the gate trench allows for the processing of the field electrode trench and field electrode to be performed without altering the gate trench. Subsequently, the protective layer is at least partially removed from the gate trench. Subsequently, a gate trench dielectric and a gate electrode are formed in the gate trench using deposition techniques, for example.

Advantageously, by using a single mask to form both the gate trench and the field electrode trench, lithography steps are reduced and simplified in comparison to conventionally known techniques that use separate masked etching steps to form a gate trench and a field electrode trench. Moreover, the processing steps used to form the field electrode trench and the field electrode merely require protection of the gate trench, and likewise the processing steps used to form the gate electrode trench and gate electrode merely require protection of the field electrode trench. Thus, the process is not sensitive to misalignment issues.

Figure 1:
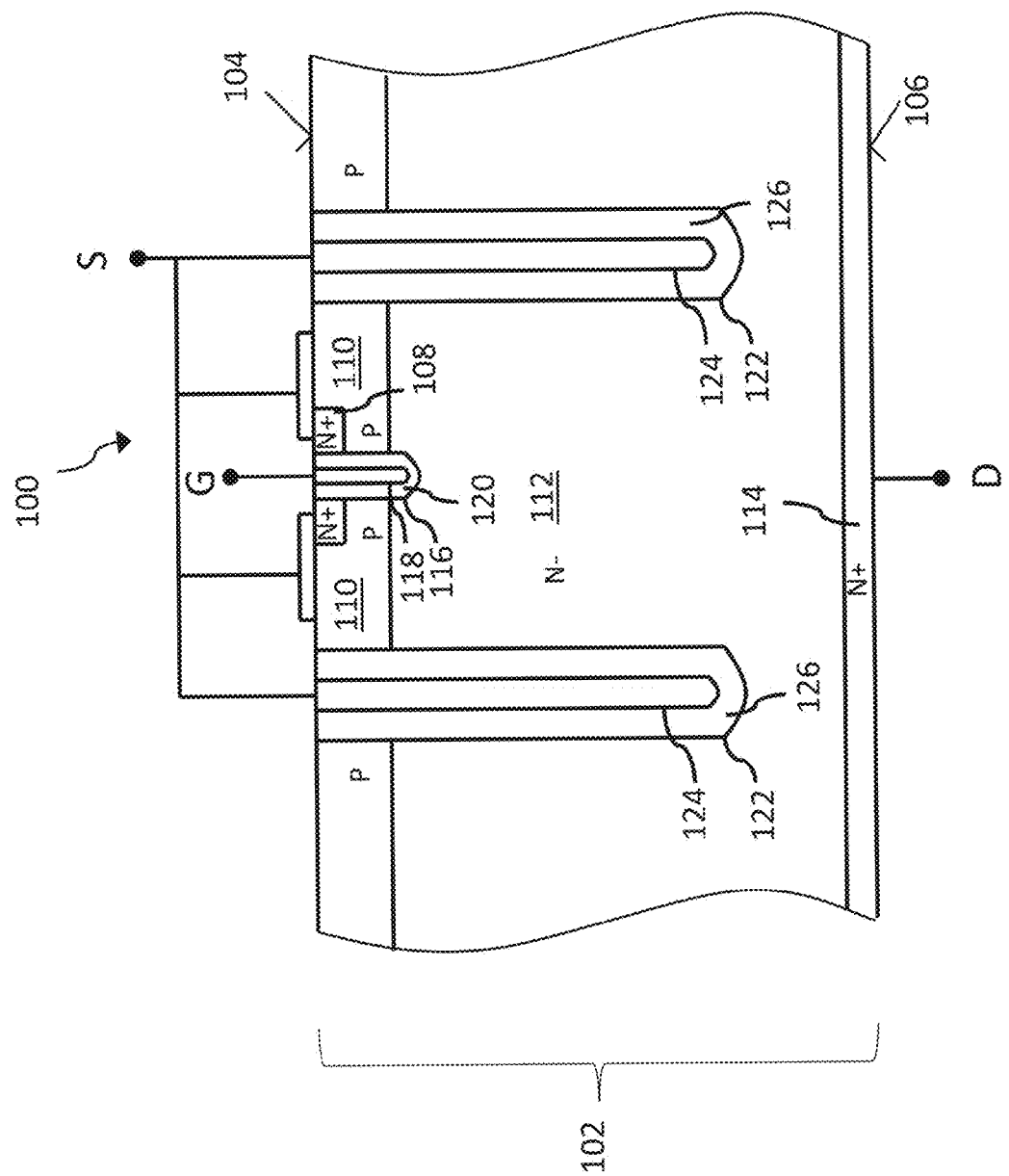
FIG. 1 illustrates a power semiconductor device including a trenched gate electrode and a trenched field electrode, according to an embodiment.

Referring to FIG. 1, a partial cross-sectional view of a power switching device 100 is depicted, according to an embodiment. The semiconductor device 100 is formed in a semiconductor substrate 102. The substrate 102 includes a main surface 104 and a rear surface 106 vertically spaced apart from the main surface 104. In this example, the device 100 is configured as a N-channel MOSFET, which includes an n-type source region 108 disposed at the main surface 104, a p-type body region 110 disposed beneath the source region 108, an n-type drift region 112 disposed beneath the body region 110, and an n-type drain region 114 that is disposed beneath the drift region 112 and extends to the rear surface 106.

The device 100 further includes a gate trench 116 vertically extending from the main surface 104 into the semiconductor substrate 102. The gate trench 116 vertically extends through the source region 108 and through the body region 110. An electrically conductive gate electrode 118 is disposed in the gate trench 116. The gate electrode 118 is dielectrically insulated from the substrate 102 by a gate dielectric 120.

The device 100 further includes field electrode trenches 122 that vertically extend from the main surface 104 into the semiconductor substrate 102 and are laterally spaced apart from the gate trench 116. The field electrode trenches 122 can vertically extend into the drift region 112 by a substantial amount (e.g., 50% of a thickness of the drift region 112 or more). An electrically conductive field electrode 124 is disposed in each field electrode trench 122. The field electrode 124 is dielectrically insulated from the substrate 102 by a field electrode dielectric 126.

According to an embodiment, the field electrode trench 122 is deeper and wider than the gate trench 116. The depth of each trench is measured from the main surface 104 to a bottom of each trench 116, 122. The width of each trench 116, 122 is measured between opposing sidewalls.

In a commonly known manner, the gate electrode 118 is configured to control an electrically conductive connection between a source terminal (S), which is in low ohmic contact with the source region 108, and a drain terminal (D), which is in low ohmic contact with the drain region 114. The gate electrode 118 is in ohmic contact with a gate terminal (G) and controls a conduction state of a channel in the body region 110, thereby completing or removing the connection between the source terminal (S) and the drain terminal (D).

The field electrode 124 is configured to provide compensating charges in the drift region 112 when the device 100 is switched off. The field electrode 124 can be tied to a fixed potential, such as the source potential. During the OFF state of the device 100, there is capacitive coupling between the positively charged donors present in the drift region 112 and the negative charges in the field electrodes 124. As a result, the likelihood of voltage breakdown in is reduced.

Figure 2:
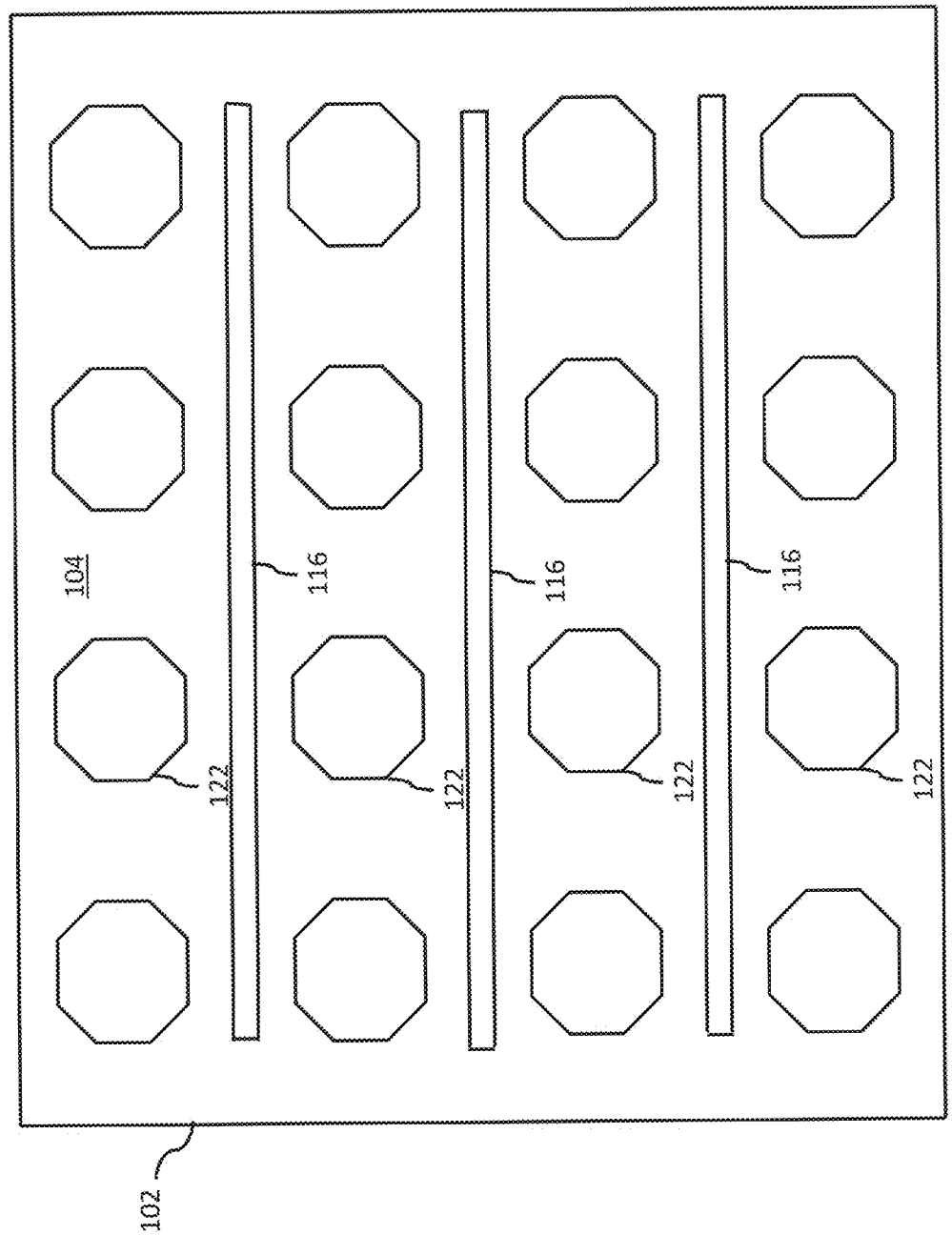
FIG. 2 illustrates the power semiconductor device of FIG. 1 from a plan view perspective, according to an embodiment.

Referring to FIG. 2, a plan view perspective of the substrate 102 is depicted, according to an embodiment. In the depicted embodiment, the field electrode trenches 122 are formed in the shape of an octagon in a cross section that is parallel to the main surface 104. More generally, the field electrode trenches 122 can have the shape of any closed loop, such as a circle, hexagon, square, rectangle, etc. The gate trenches 116 have a substantially larger length, as measured in a direction parallel to the main surface 104 and the sidewalls of the gate trench 116, than a length of the field electrode trenches 122, as measured in the same direction. Multiple ones of the field electrode trenches 122 occur at regular intervals alongside a single one of the gate trenches 116. This represents just one example of a variety of different configurations that are possible using a so-called "needle trench" concept. The basic concept shown in FIG. 2 may be replicated multiple times in a single substrate 102.

Figure 3:
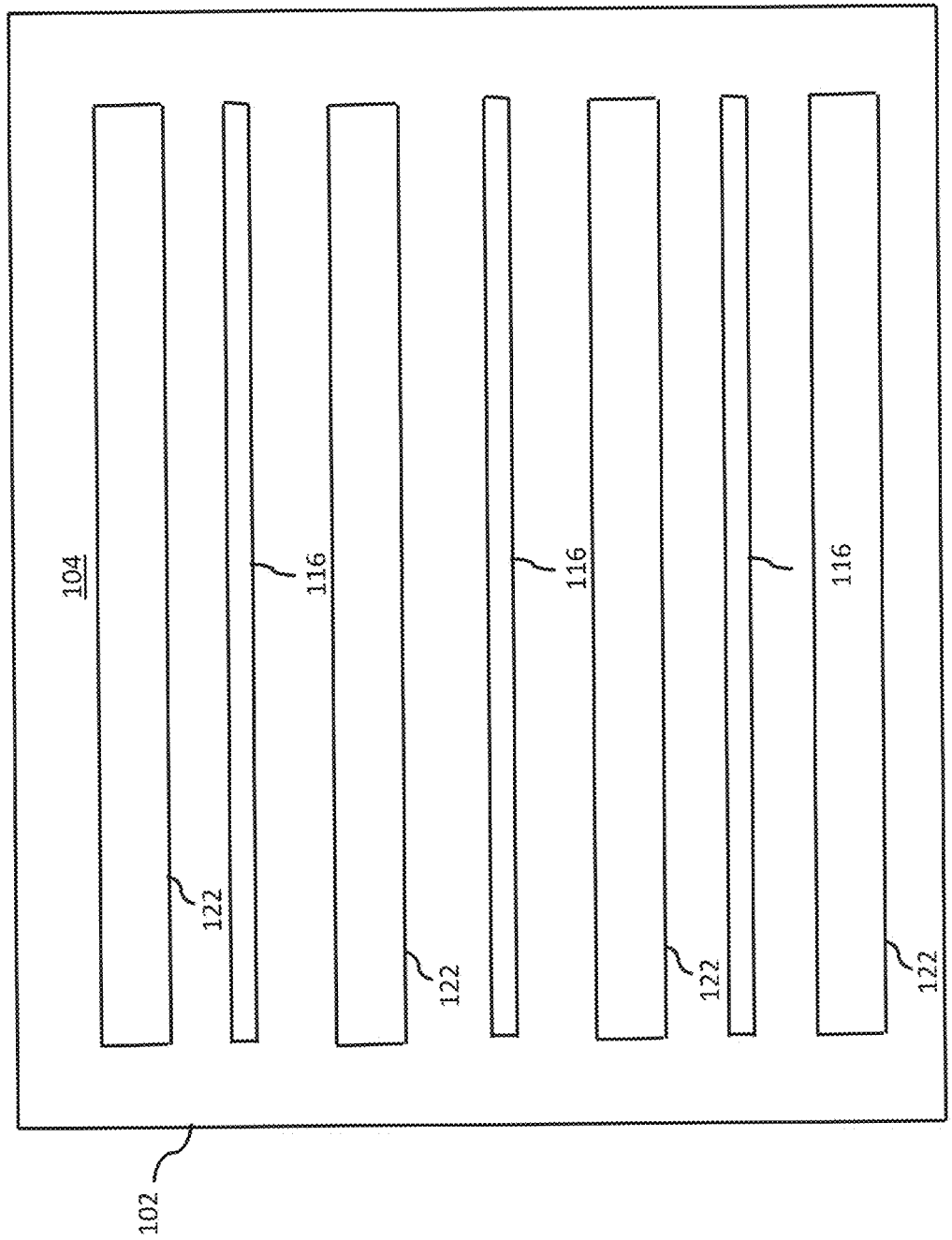
FIG. 3 illustrates the power semiconductor device of FIG. 1 from a plan view perspective, according to an embodiment.

Referring to FIG. 3, a plan view perspective of the substrate 102 is depicted, according to another embodiment. In the depicted embodiment, the field electrode trenches 122 are have the same length of the gate trenches 116 and have a greater width as the gate trenches 116. The basic concept shown in FIG. 3 may be replicated multiple times in a single substrate 102.

Selected method steps for forming the power switching device 100 will now be described with reference to FIGS. 4-19.

Figure 4:
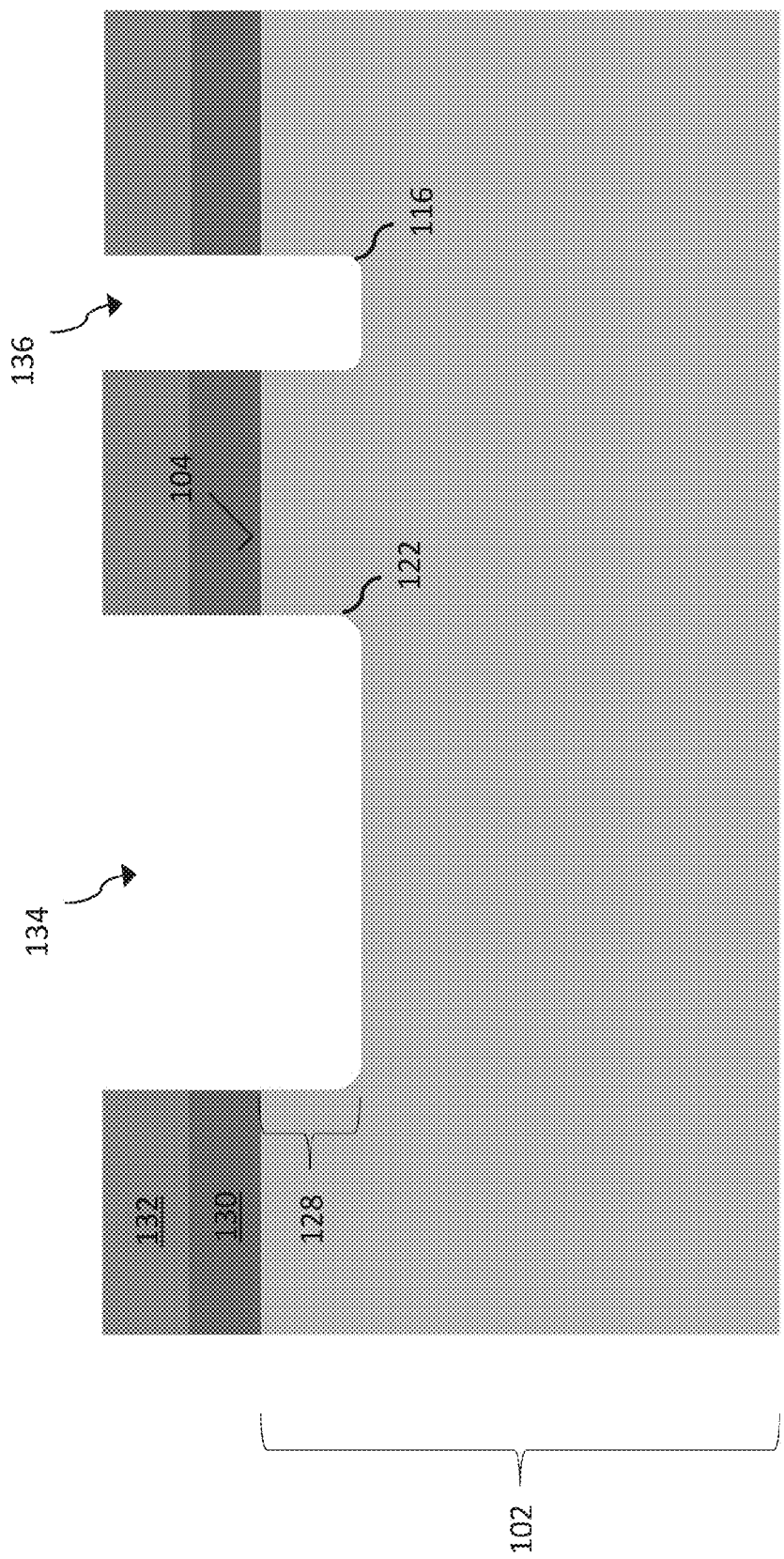
FIG. 4 illustrates simultaneously forming an upper portion of a field electrode trench and a gate trench in a method of forming the power semiconductor device, according to an embodiment.

Referring to FIG. 4, a method of simultaneously forming an upper portion 128 of the field electrode trench 122 and the gate trench 116 is depicted. According to the method, a semiconductor substrate 102 is provided. The semiconductor substrate 102 may include one or more of a variety of semiconductor materials that are used to form integrated circuit device 100s, such as silicon (Si), silicon carbide (SiC), germanium (Ge), a silicon germanium crystal (SiGe), gallium nitride (GaN), gallium arsenide (GaAs), and the like. The semiconductor substrate 102 may be a bulk semiconductor material or alternatively may include one or more epitaxially grown layers. The semiconductor substrate 102 may be undoped or may have intrinsic or intentional doping.

A first dielectric layer 130 is formed on the main surface 104 of the substrate 102. In general, the first dielectric layer 130 can be formed from any of a variety of electrical insulators including semiconductor nitrides, semiconductor oxides, and semiconductor oxynitrides, such as silicon nitride (SiN), silicon dioxide ($SiO_2$), and silicon oxynitride ($SiO_xN_y$).

A first mask 132 is formed on the first dielectric layer 130. The first mask 132 can be formed from a photoresist material, for example. The first mask 132 is patterned to include first and second openings 134, 136. This can be done using conventionally known photolithography techniques. The shape of the first opening 134, as seen from a plan view perspective of the substrate 102, corresponds to the shape of the field electrode trenches 122 as seen in FIG. 2. The shape of the second opening 136, as seen from a plan view perspective of the substrate 102, corresponds to the shape of the gate trenches 116 as seen in FIG. 2.

After the first mask 132 is formed and patterned, an etching process is performed. In general, this etching process can be done using any of a variety of techniques. According to an embodiment, the etching process is an anisotropic etching process. The etching process removes sections of the first dielectric layer 130 and the substrate 102 that are exposed by the first and second openings 134, 136. As a result, an upper portion 128 of the field electrode trench 122 and the gate trench 116 are formed simultaneously. Moreover, the upper portion 128 of the field electrode trench 122 and the gate trench 116 have approximately the same depth because they are formed by a common etching process.

Figure 5:
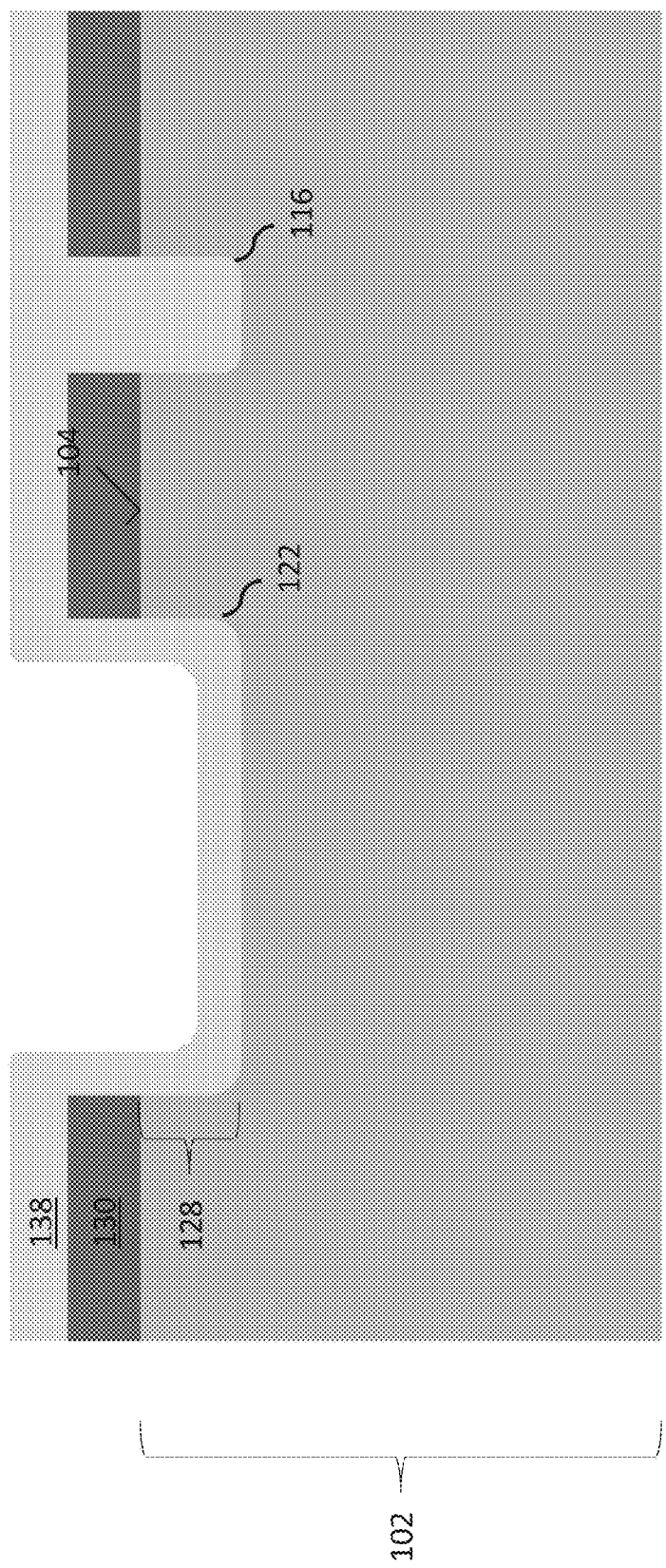
FIG. 5 illustrates forming a first protective later in a method of forming the power semiconductor device, according to an embodiment.

Referring to FIG. 5, the first mask 132 is removed and subsequently a first protective layer 138 is formed on the substrate 102. In general, the first protective layer 138 can be formed from any material that is resistant to certain etchant materials. According to an embodiment, the first protective layer 138 is a conformal layer of dielectric material, e.g., a semiconductor nitride, a semiconductor oxide, or a semiconductor oxynitride. The first protective layer 138 is formed in such a way that it completely fills the gate trench 116. That is, the first protective layer 138 that forms in the gate trench 116 at least reaches the main surface 104 of the substrate 102. Meanwhile, the first protective layer 138 that forms in the upper portion 128 of the field electrode trench 122 lines the sidewalls and bottom of the trench 122, with a central section of the field electrode trench 122 being devoid of the first protective layer 138.

Figure 6:
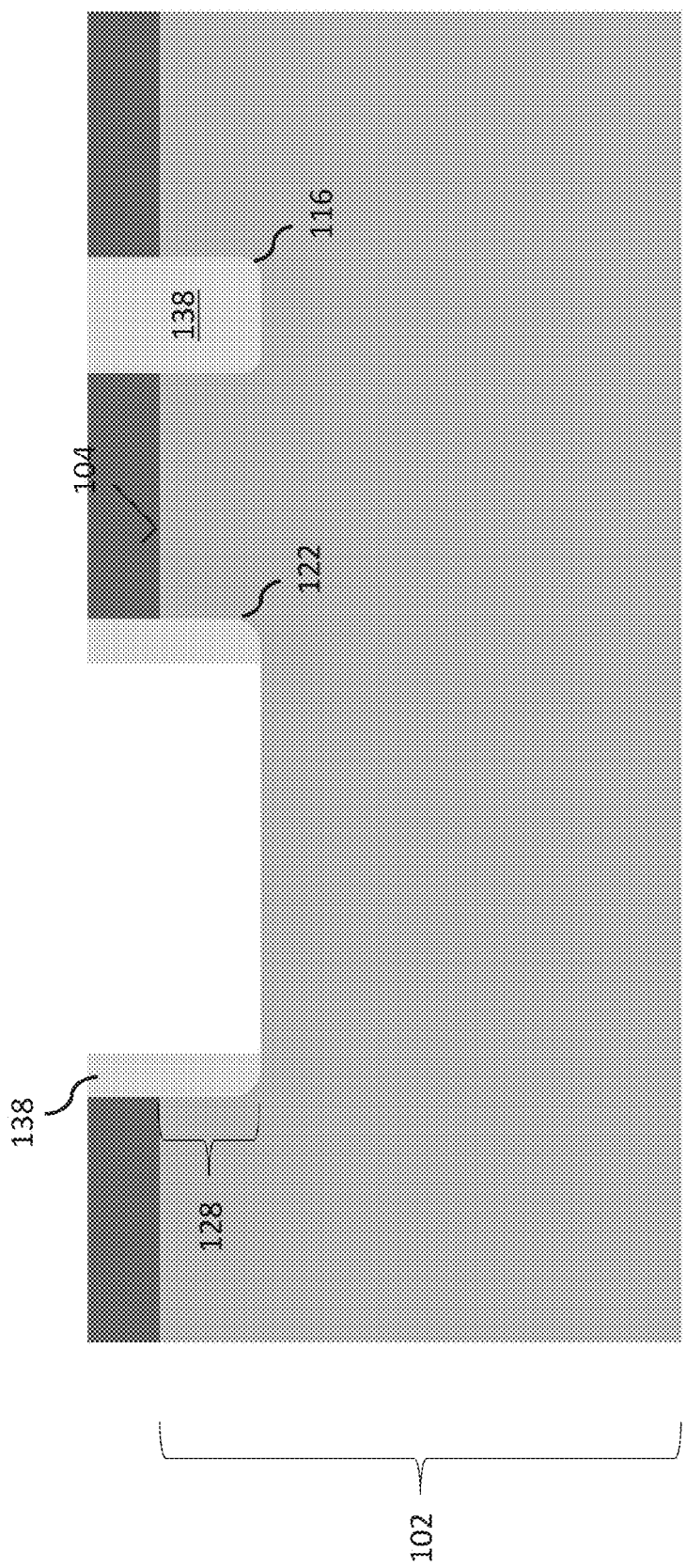
FIG. 6 illustrates removing the first protective later from the bottom of the field electrode trench in a method of forming the power semiconductor device, according to an embodiment.

Referring to FIG. 6, a section of the first protective layer 138 that lines the bottom of the upper portion 128 of the field electrode trench 122 is removed. This can be done using an anisotropic dry etch technique, for example. As this anisotropic process exclusively (or mainly) removes material in the vertical direction, the section of the first protective layer 138 that lines the bottom of the upper portion 128, which represents the thinnest region of dielectric material, can be completely removed. As a result, a bottom of the upper portion 128 of the field electrode trench 122 is exposed from the first protective layer 138. Meanwhile, the portions of the first protective layer 138 that line the sidewalls of the upper portion 128 of the field electrode trench 122 as well as the portions of the first protective layer 138 that fill the gate trench 116 remain intact.

Figure 7:
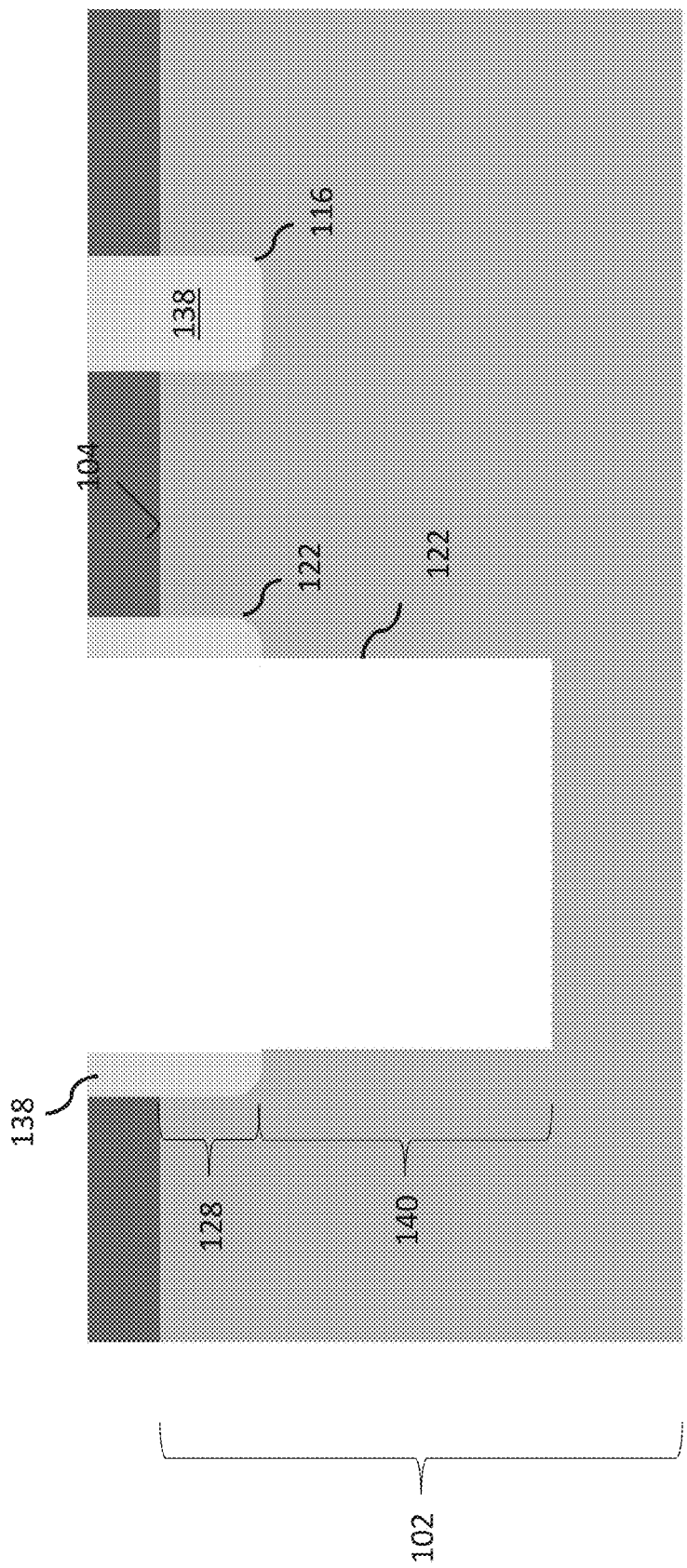
FIG. 7 illustrates removing semiconductor material from the exposed bottom of the upper portion of the field electrode trench in a method of forming the power semiconductor device, according to an embodiment.

Referring to FIG. 7, semiconductor material is removed from the exposed bottom of the upper portion 128 of the field electrode trench 122. This may be done using a dry etching technique, for example. The etching technique is selective to the material of the substrate 102 relative to the material of the first protective layer 138. For example, in the case that the substrate 102 is a silicon substrate 102 and the first protective layer 138 is an oxide, the etching technique removes silicon but not oxide. In this way, the field electrode trench 122 is deepened while the first protective layer 138 filling the gate trench 116 remains intact. As a result of this process, the field electrode trench 122 includes a lower portion 140 that vertically extends from the upper portion 128 of the trench into the substrate 102. Due to the presence of the first protective layer 138 in the upper portion 128, the upper portion 128 is slightly wider than the lower portion 140. In the depicted embodiment, an anisotropic etching technique is used such that the sidewalls of the lower portion 140 of the field electrode trench 122 extend approximately in the vertical direction. Alternatively, different isotropies may be used such that the lower portion 140 of the field electrode 124 tapers inward or outward as it vertically extends into the substrate 102.

Figure 8:
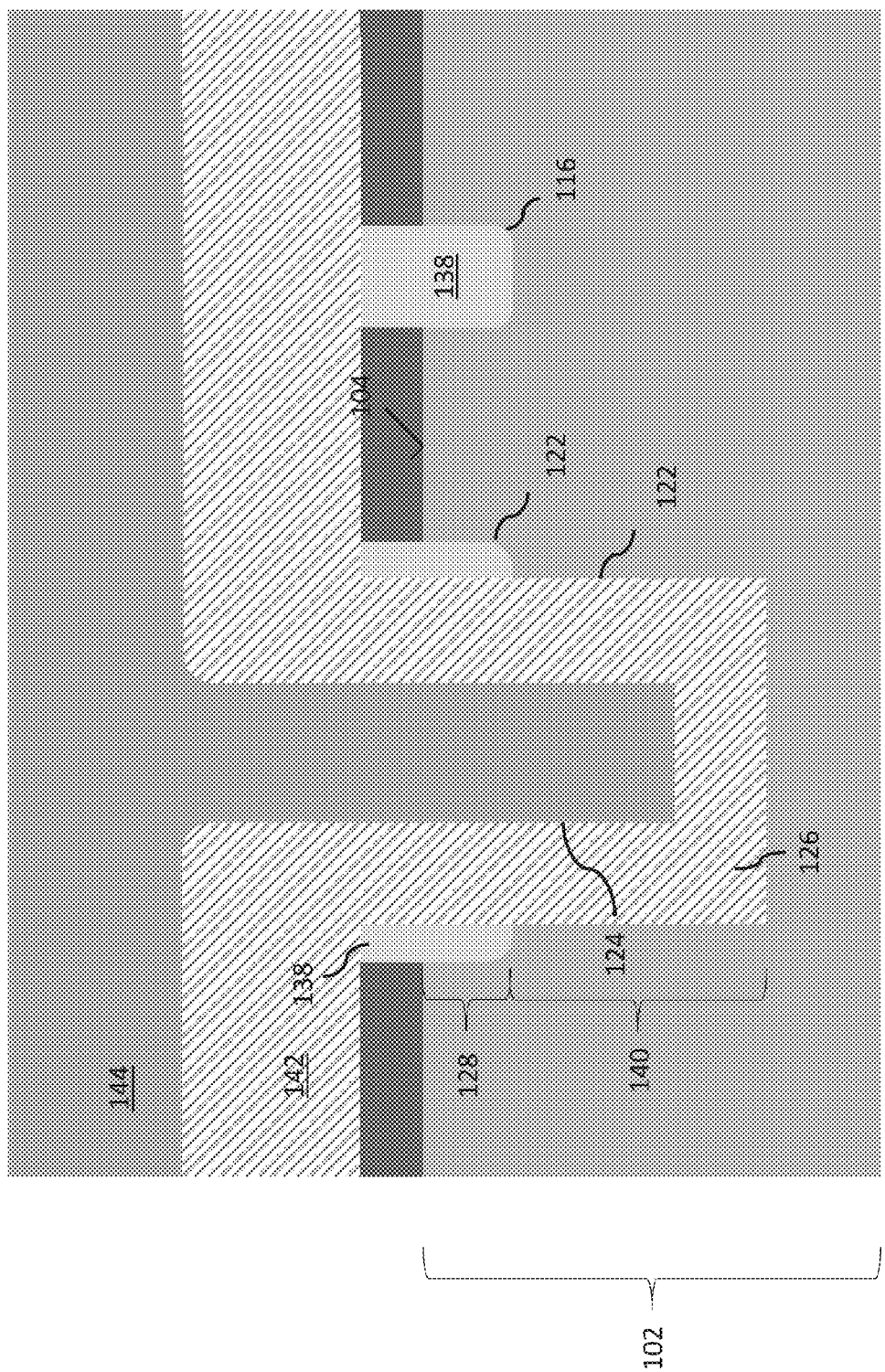
FIG. 8 illustrates forming an electrically conductive field electrode and a field electrode dielectric in the upper and lower portions of the field electrode trench in a method of forming the power semiconductor device, according to an embodiment.

Referring to FIG. 8, an electrically conductive field electrode 124 and a field electrode dielectric 126 are formed in the upper and lower portions 128, 140 of the field electrode trench 122. This is done while the gate trench 116 remains completely filled by the first protective layer 138. According to an embodiment, the field electrode dielectric 126 is formed by depositing a conformal field electrode dielectric layer 142 on the substrate 102. The field electrode dielectric layer 142 may include any of a variety of electrical insulators, such as silicon dioxide ($SiO_2$). The field electrode dielectric layer 142 lines the bottom and sidewalls of the lower portion 140 of the field electrode trench 122. In the upper portion 128 of the field electrode trench 122, the field electrode dielectric layer 142 covers the remaining sections of the first protective layer 138.

After forming the field electrode dielectric layer 142, a conformal field electrode layer 144 is formed. The field electrode layer 144 includes an electrically conductive material, such as polysilicon, or a conductive metal, such as tungsten. According to an embodiment, the field electrode 124 is formed by depositing the field electrode layer 144 until the center of the field electrode trench 122 is completely filled. That is, the field electrode layer 144 is formed to completely occupy the portion of the field electrode trench 122 between the opposing sections of the field electrode dielectric 126.

Figure 9:
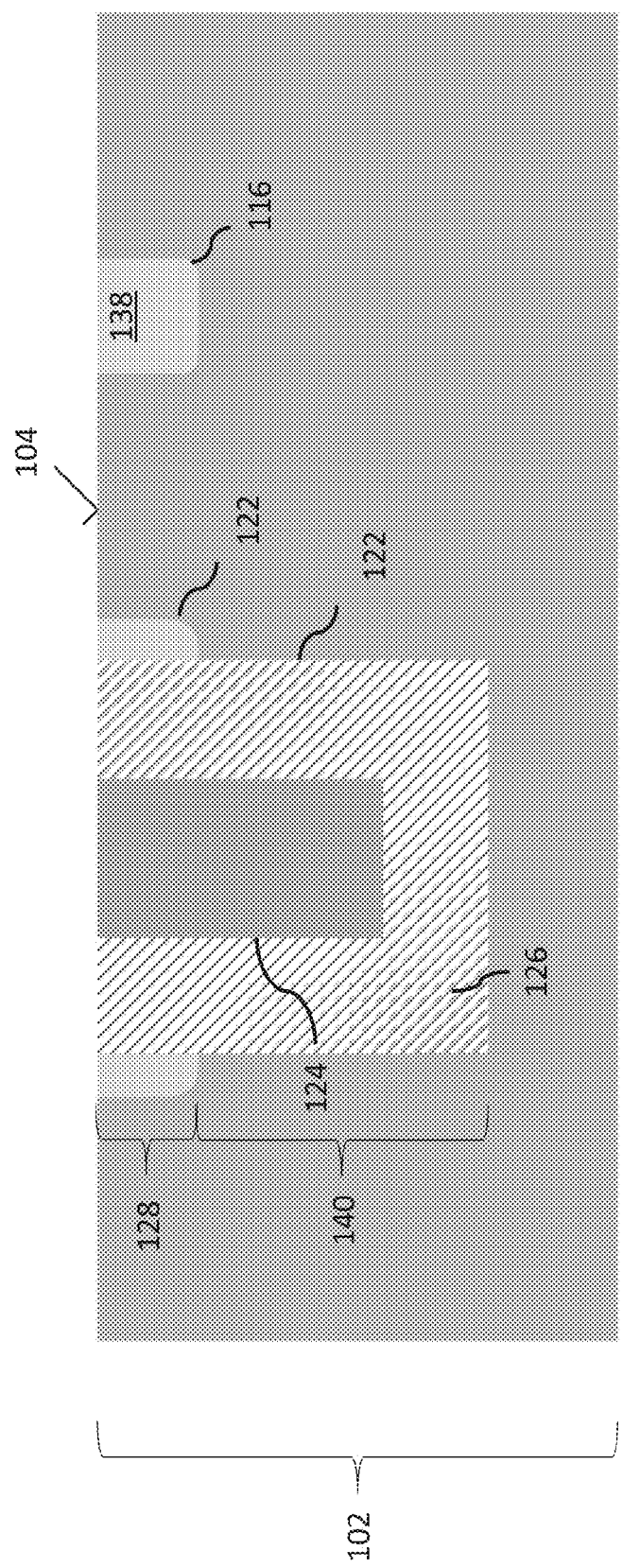
FIG. 9 illustrates removing the material of the field electrode and field electrode dielectric layer that is disposed outside of the field electrode trench in a method of forming the power semiconductor device, according to an embodiment.

Referring to FIG. 9, sections of the field electrode dielectric layer 142 and the field electrode layer 144 that are disposed outside of the field electrode trench 122 are removed. That is, the substrate 102 is processed such that the field electrode dielectric layer 142 and the field electrode layer 144 only exist within the field electrode trench 122. Further, any remaining portions of the first dielectric layer 130 and the first protective layer 138 that are disposed at or above the main surface 104 are removed. This may be done using a planarization technique, such as a CMP (chemical-mechanical planarization). Alternatively, this material may be removed using an etching technique that is selective between dielectric material and the material of the substrate 102. As a result, the main surface 104 of the substrate 102 is exposed.

Figure 10:
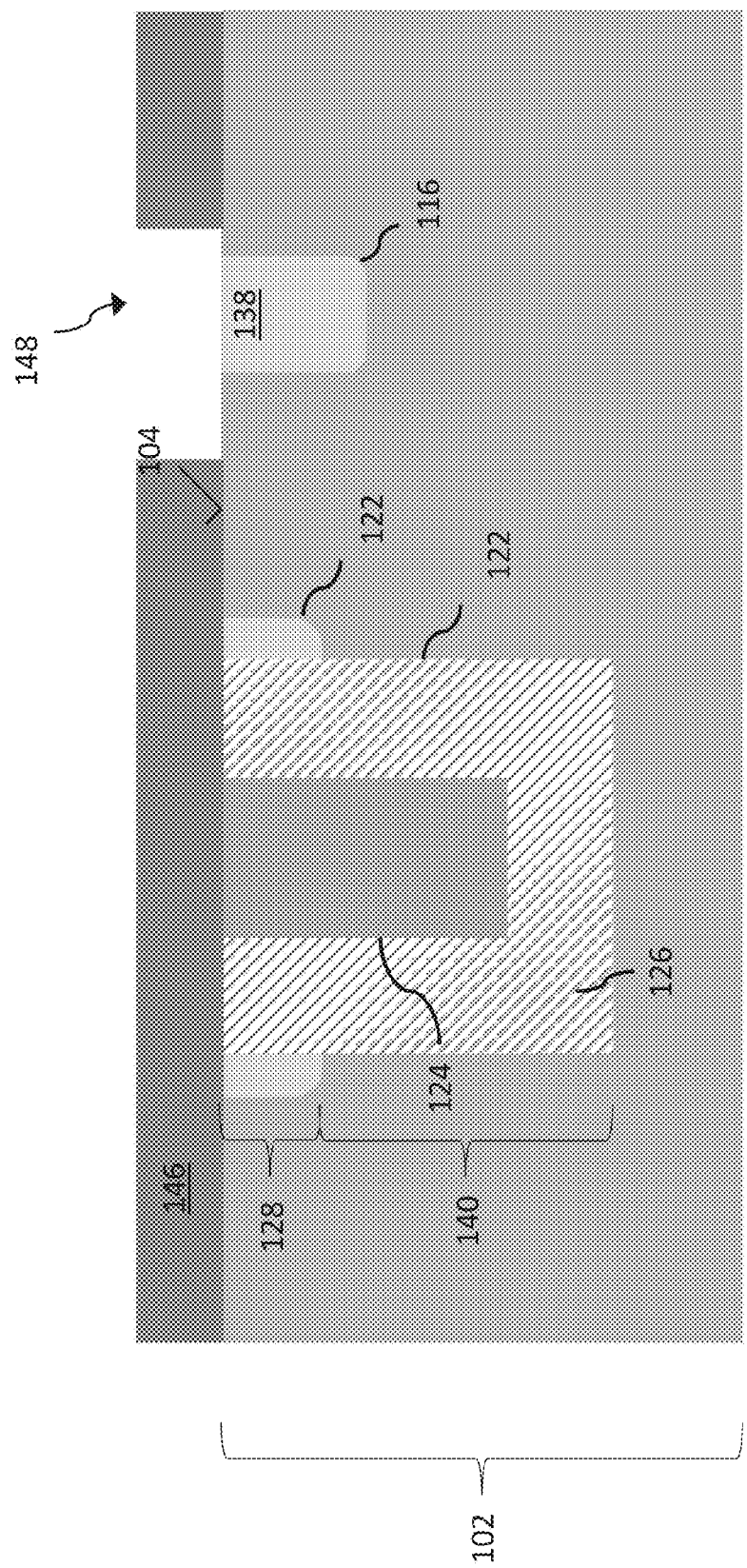
FIG. 10 illustrates forming a second mask that covers the field electrode trench and exposes the gate trench in a method of forming the power semiconductor device, according to an embodiment.

Referring to FIG. 10, after the field electrode dielectric 126 and the field electrode 124 are formed, a second mask 146 is formed on the main surface 104. The second mask 146 can be formed from a photoresist material, for example. The second mask 146 is patterned to include a third opening 148. This can be done using conventionally known photolithography techniques, for example. The third opening 148 is disposed over the gate trench 116 and is at least as wide as the gate trench 116 such that the gate trench 116 is uncovered from the second mask 146. Optionally, the second mask 146 may be wider than the gate trench 116 to provide a degree of tolerance for any mask alignment issues. In any case, the second mask 146 completely covers the field electrode trench 122 and thus covers the field electrode 124 and the field electrode dielectric 126.

Figure 11:
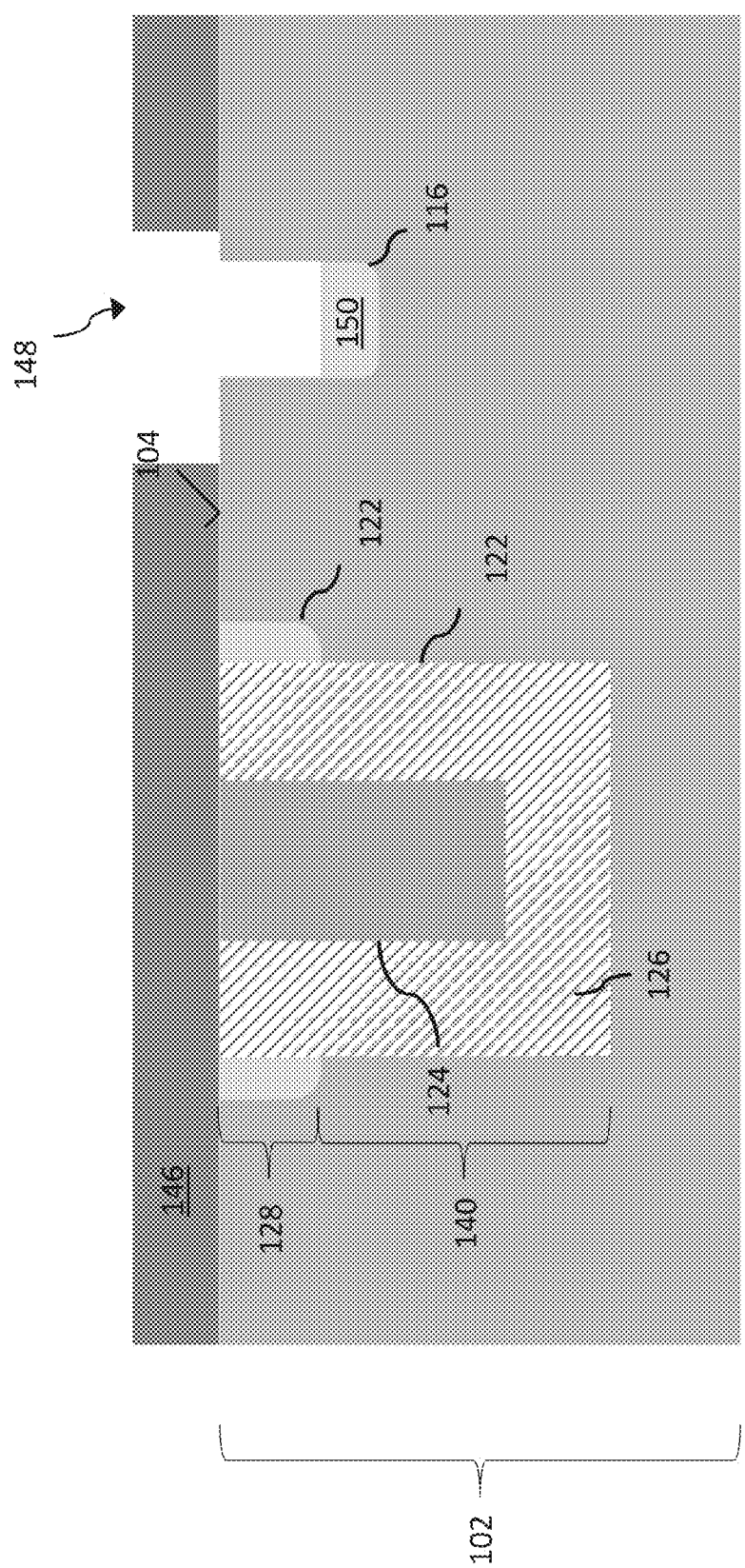
FIG. 11 illustrates removing some of the first protective layer from the gate trench in a method of forming the power semiconductor device, according to an embodiment.

Referring to FIG. 11, the first protective layer 138 is removed from the gate trench 116, according to an embodiment. This can be done using an anisotropic etching process, for example. In this case, the first protective layer 138 is partially etched away from the gate trench 116. That is, the etching process is stopped before the first protective layer 138 is completely removed. As a result, a portion 150 of the first protective layer 138 remains at the bottom of the gate trench 116. This may be preferable in some power applications in which a thicker dielectric region at the bottom of the gate trench 116 is used to reduce the miller capacitance (i.e., $Q_{GD}$).

Figure 12:
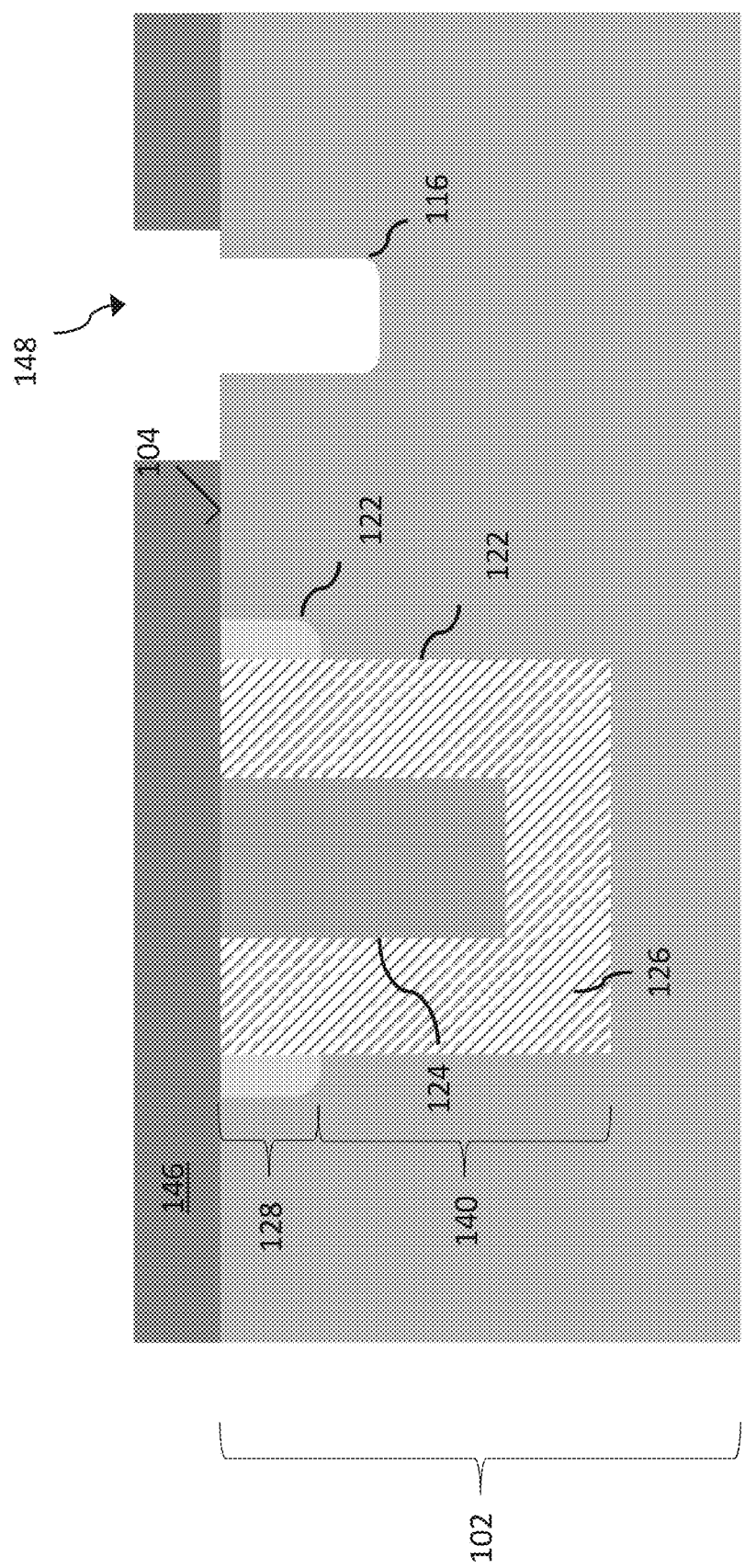
FIG. 12 illustrates removing all of the first protective layer from the gate trench in a method of forming the power semiconductor device, according to an embodiment.

Referring to FIG. 12, the first protective layer 138 from the gate trench 116 is removed, according to an alternate embodiment. In this case, the same process sequence as described with reference to FIG. 10 is performs, with the exception that the first protective layer 138 is completely etched away from the gate trench 116. As a result, the gate trench 116 is devoid of any material at the sidewalls or bottom.

FIGS. 13-19 depict selected method steps that are performed after the partial trench etching strep described with reference to FIG. 11. Alternatively, the same method steps can be performed after the complete trench etching step described with reference to FIG. 12.

Figure 13:
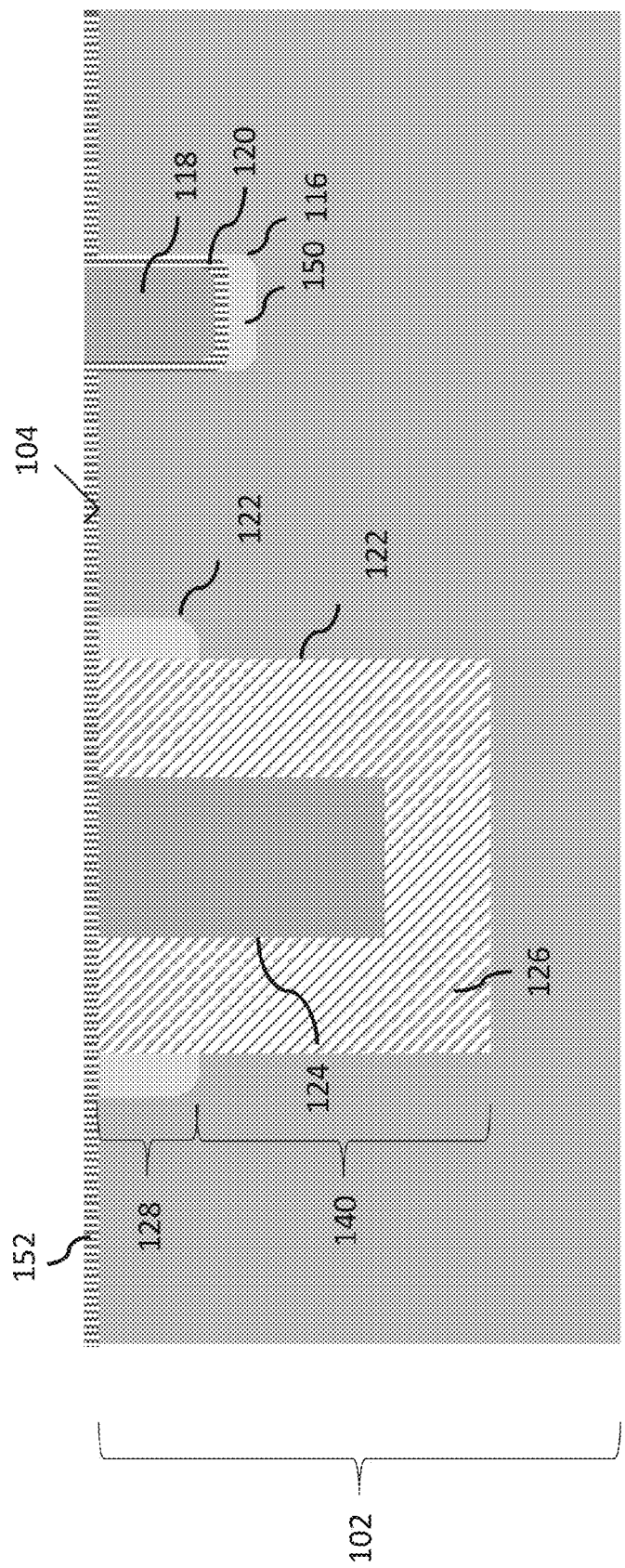
FIG. 13 illustrates forming a conformal gate dielectric layer that covers the field electrode and lines sidewalls of the gate trench in a method of forming the power semiconductor device, according to an embodiment.

Referring to FIG. 13, the second mask 146 is removed and a gate dielectric layer 152 is formed. The gate dielectric layer 152 provides the gate dielectric 120 for the device 100. The gate dielectric layer 152 can be formed by depositing a conformal layer of oxide, such as silicon dioxide ($SiO_2$). The conformal gate dielectric layer 152 covers the field electrode 124 and lines sidewalls of the gate trench 116. In the embodiment in which the portion of the first protective layer 138 remains at the bottom of the gate trench 116, the gate dielectric layer 152 forms on the remaining portion of the first protective layer 138. In the alternate embodiment in which the first protective layer 138 is completely removed from the gate trench 116, the conformal gate dielectric layer 152 lines the complete perimeter of the gate trench 116.

After forming the gate dielectric layer 152, the gate electrode 118 is formed in the gate trench 116. The gate electrode 118 can be formed by depositing a conformal electrically conductive layer, such as a polysilicon layer. At this time, the field electrode 124 remains covered by the gate dielectric layer 152 and thus does not come into contact with the electrically conductive layer that is used to form the gate electrode 118. Subsequently, the gate dielectric layer 152 and the electrically conductive layer used to form the gate electrode 118 are planarized or etched in a similar or identical technique as the technique described with reference to FIG. 8.

Figure 14:
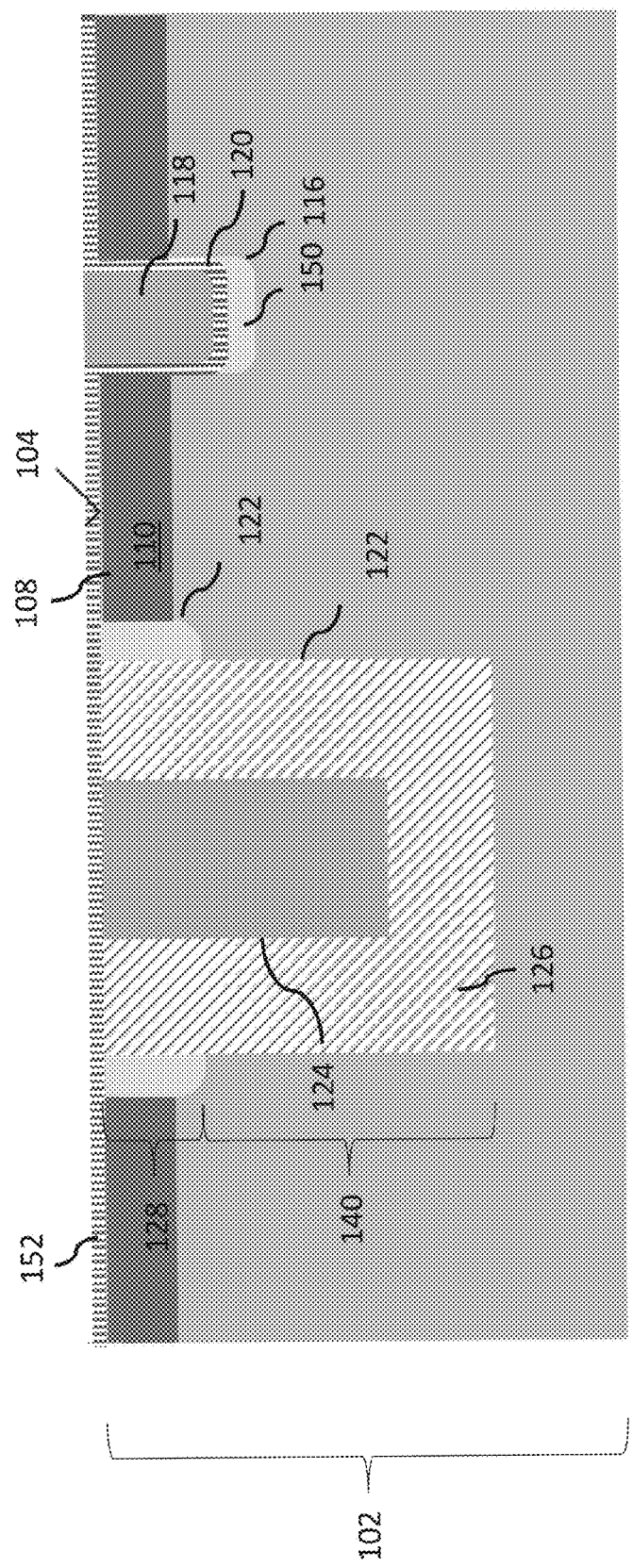
FIG. 14 illustrates forming doped body and source regions in a method of forming the power semiconductor device, according to an embodiment.

Referring to FIG. 14, source and body regions 108, 110 are formed in the substrate 102. The source and body regions 108, 110 have an opposite doping type from one another and laterally extend between the field electrode trench 122 and the gate trench 116. According to one embodiment, the body region 110 is formed by implanting or diffusing second conductivity type (e.g., p-type) dopants into the main surface 104. Subsequently, the source region 108 is formed by implanting or diffusing first (opposite) conductivity type (e.g., n-type) dopants into the main surface 104 with a higher dopant concentration and shallower penetration depth than the dopants of the body region 110.

Figure 15:
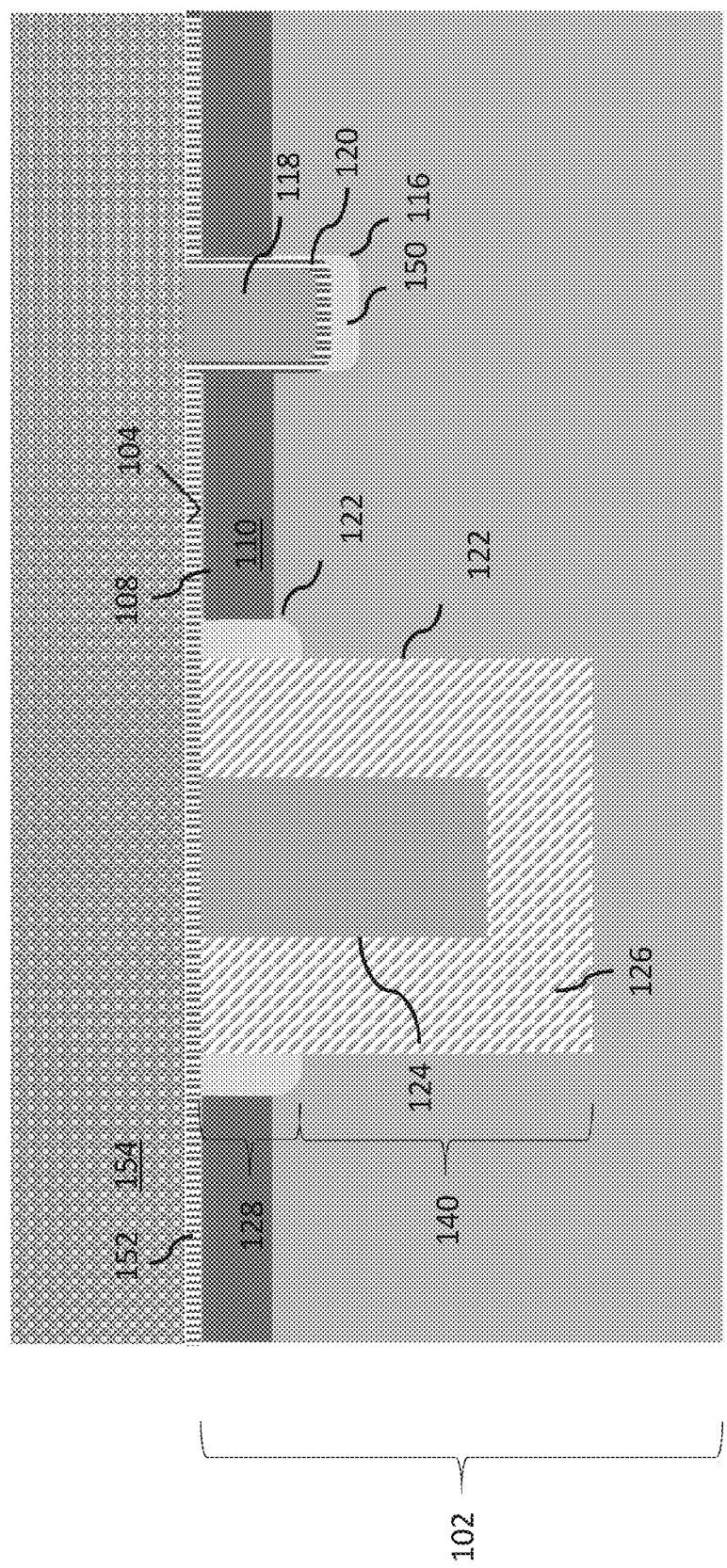
FIG. 15 illustrates forming an interlayer dielectric layer in a method of forming the power semiconductor device, according to an embodiment.

Referring to FIG. 15 an interlayer dielectric layer 154 is formed on the on the main surface 104. In general, the interlayer dielectric layer 154 can be formed from any of a variety of electrical insulators including semiconductor nitrides, semiconductor oxides, and semiconductor oxynitrides, such as silicon nitride (SiN), silicon dioxide ($SiO_2$), and silicon oxynitride ($SiO_xN_y$). The interlayer dielectric layer 154 is formed over the gate trench 116 and the field electrode trench 122 and thus covers the gate electrode 118 and the field electrode 124.

Figure 16:
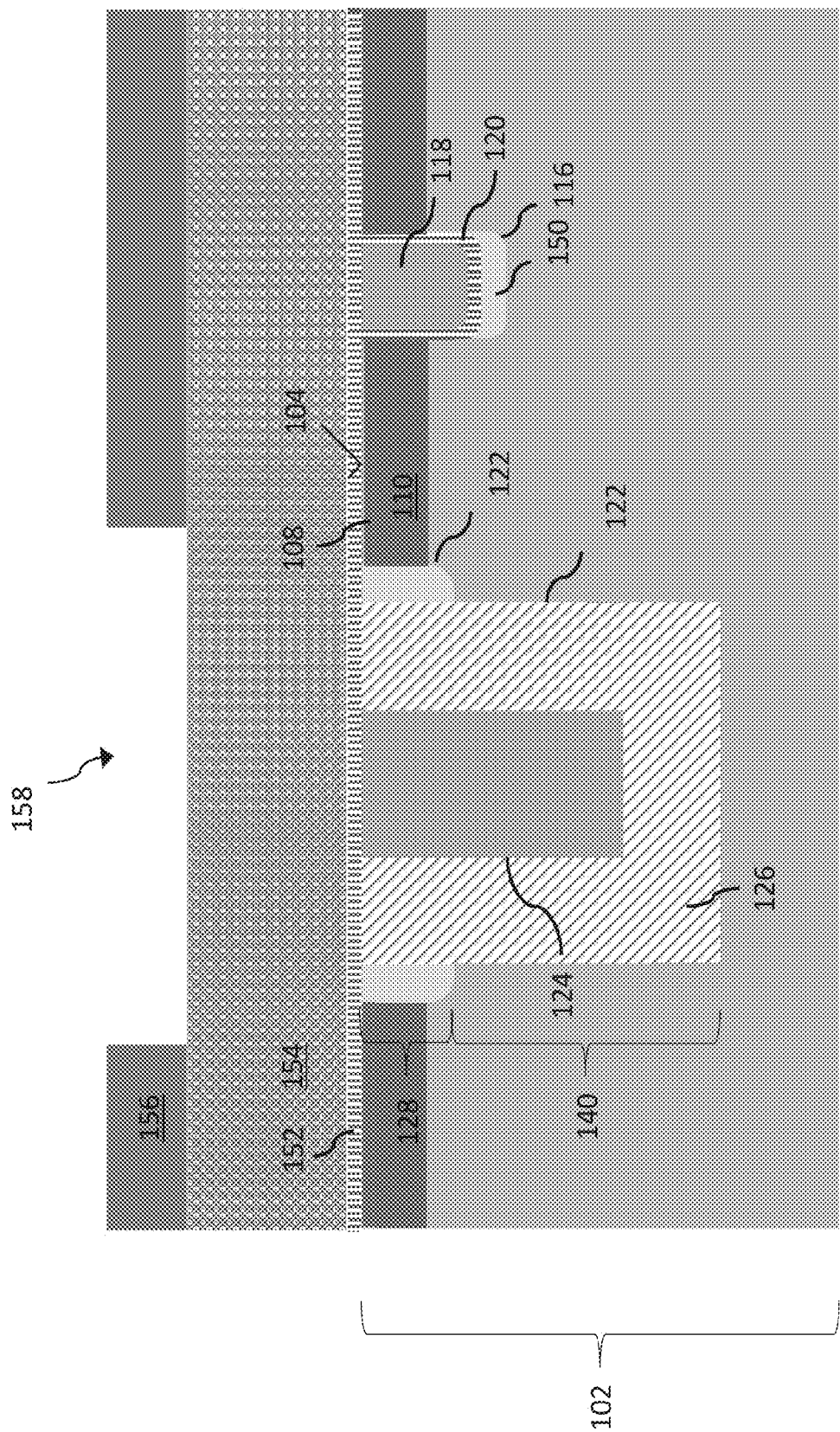
FIG. 16 illustrates forming a second mask over the field electrode trench in a method of forming the power semiconductor device, according to an embodiment.

Referring to FIG. 16, a third mask 156 is formed on the interlayer dielectric layer 154. The third mask 156 can be formed from a photoresist material, for example. The third mask 156 is patterned to include a fourth opening 158. This can be done using conventionally known photolithography techniques, for example. The fourth opening 158 is disposed over the field electrode trench 122 and is at least as wide as the field electrode trench 122. Optionally, the fourth opening 158 can be wider than the field electrode trench 122 to provide a degree of tolerance for any mask alignment issues. In any case, the third mask 156 completely covers the gate trench 116.

Figure 17:
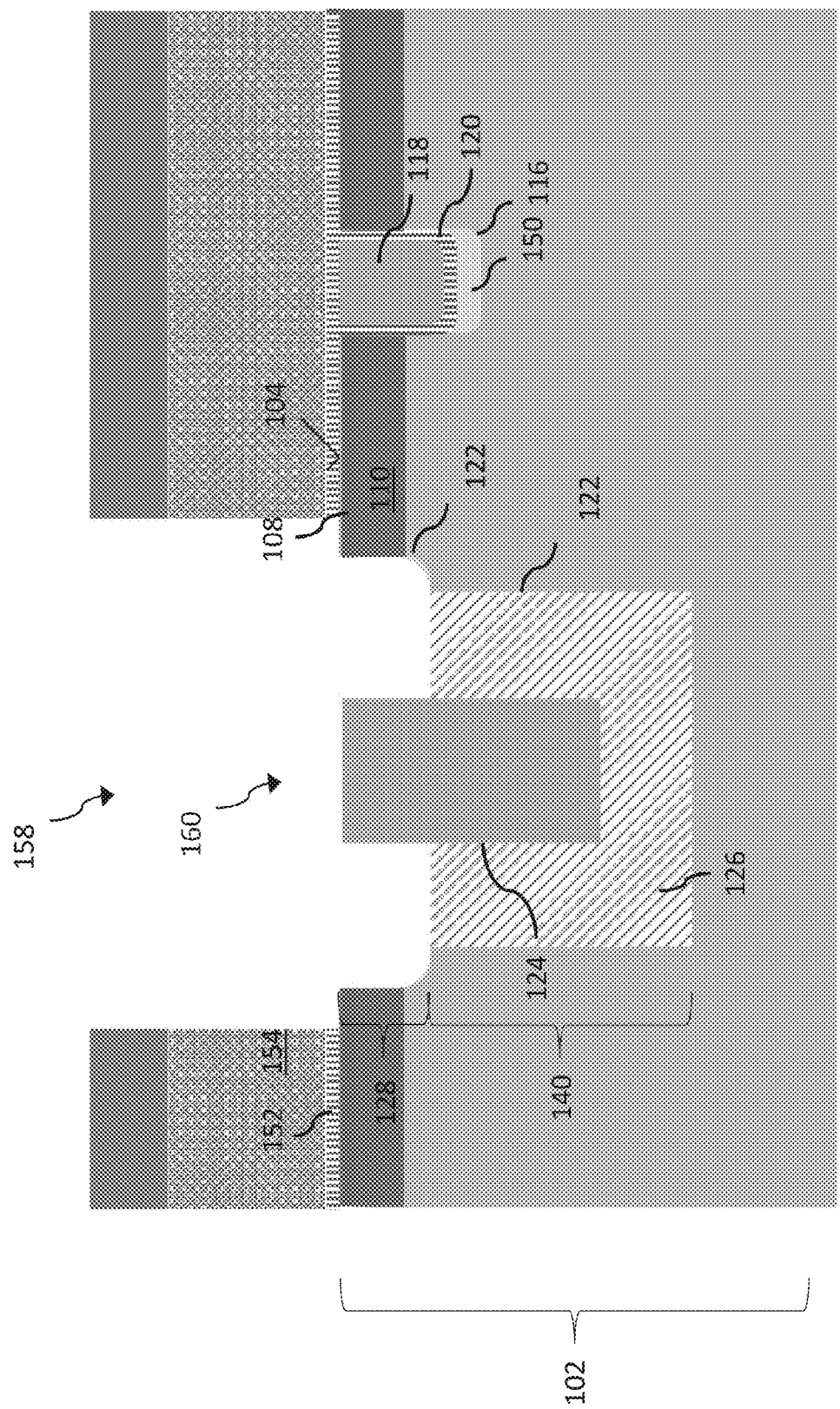
FIG. 17 illustrates forming an opening in the interlayer dielectric layer thereby exposing the field electrode in a method of forming the power semiconductor device, according to an embodiment.

Referring to FIG. 17, an opening 160 is formed in the interlayer dielectric layer 154 over the field electrode trench 122. This can be done using an anisotropic dry etch technique, for example. The etching process is carried out such that a complete section of the interlayer dielectric layer 154 that is disposed over the field electrode trench 122 is removed. In addition, subjacent dielectric material including sections of the gate dielectric layer 152, the field electrode dielectric 126, and the first protective layer 138 are removed. As a result, a top of the field electrode 124 is exposed.

Figure 18:
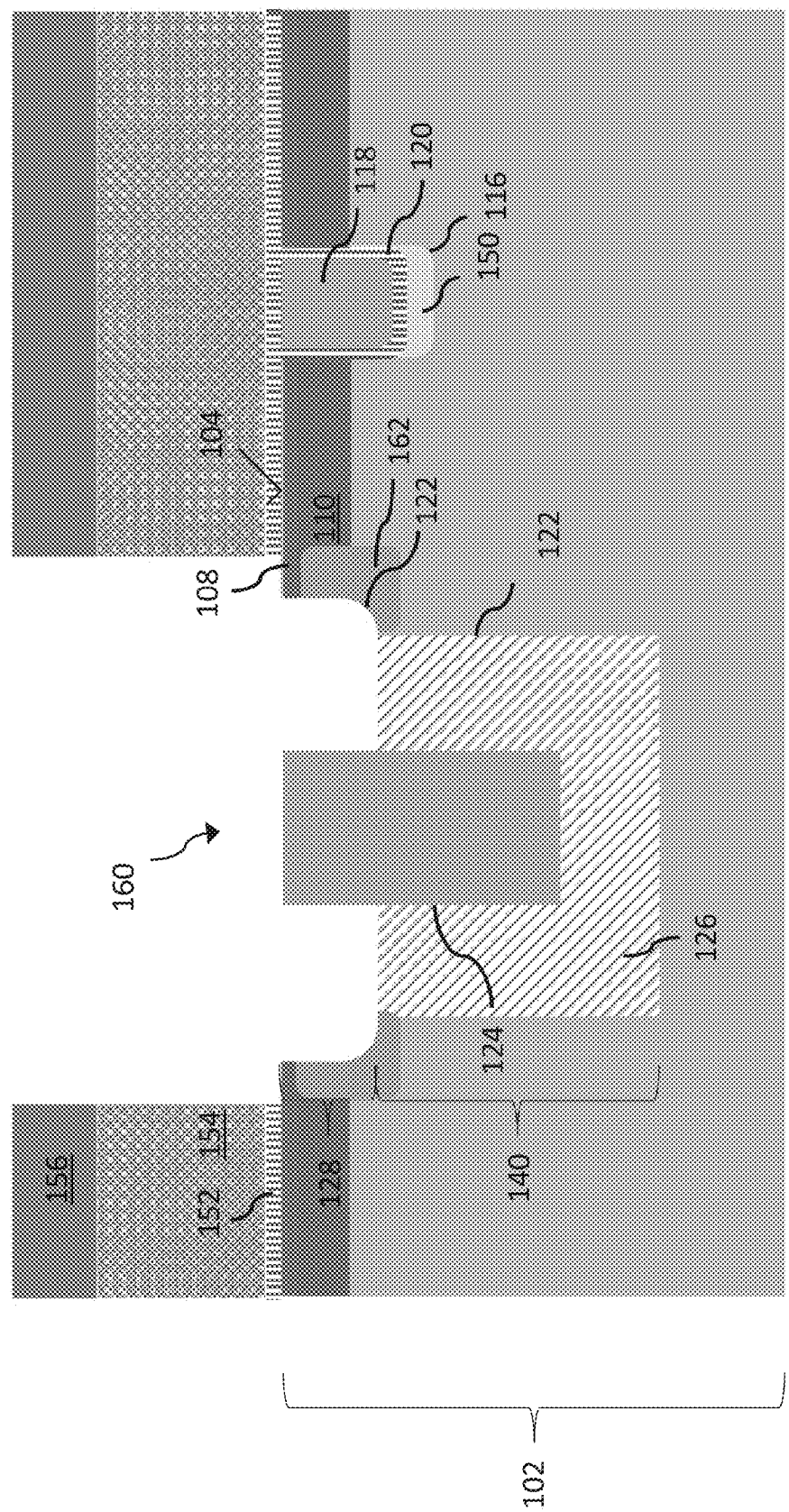
FIG. 18 illustrates forming a body extension region in a method of forming the power semiconductor device, according to an embodiment.

Referring to FIG. 18, dopants having the second conductivity type (e.g., p-type) are implanted or diffused into the semiconductor substrate 102. These dopants pass through the opening 160 and penetrate the sidewalls of the upper portion 128 of the field electrode trench 122. Meanwhile, outside of the opening 160, the third mask 156 and the interlayer dielectric layer 154 prevent the dopants from penetrating the substrate 102. As a result of this doping process, a body extension region 162 that extends from the sidewalls of the upper portion 128 of the field electrode trench 122 into the substrate 102 is formed. The body extension region 162 is formed to connect with the body region 110 and form a continuous body region 110 that extends from the sidewalls of the gate trench 116 to the sidewalls of the field electrode trench 122. To this end, and angled ion implantation technique may be used so that the dopants adequately penetrate in the lateral direction and reach the body region 110. By forming the body extension region 162, the source region 108 remains separated from the drift region 112 (which corresponds to the drain terminal of the device 100) and the possibility of electrical short across the output of the device 100 is prevented.

Figure 19:
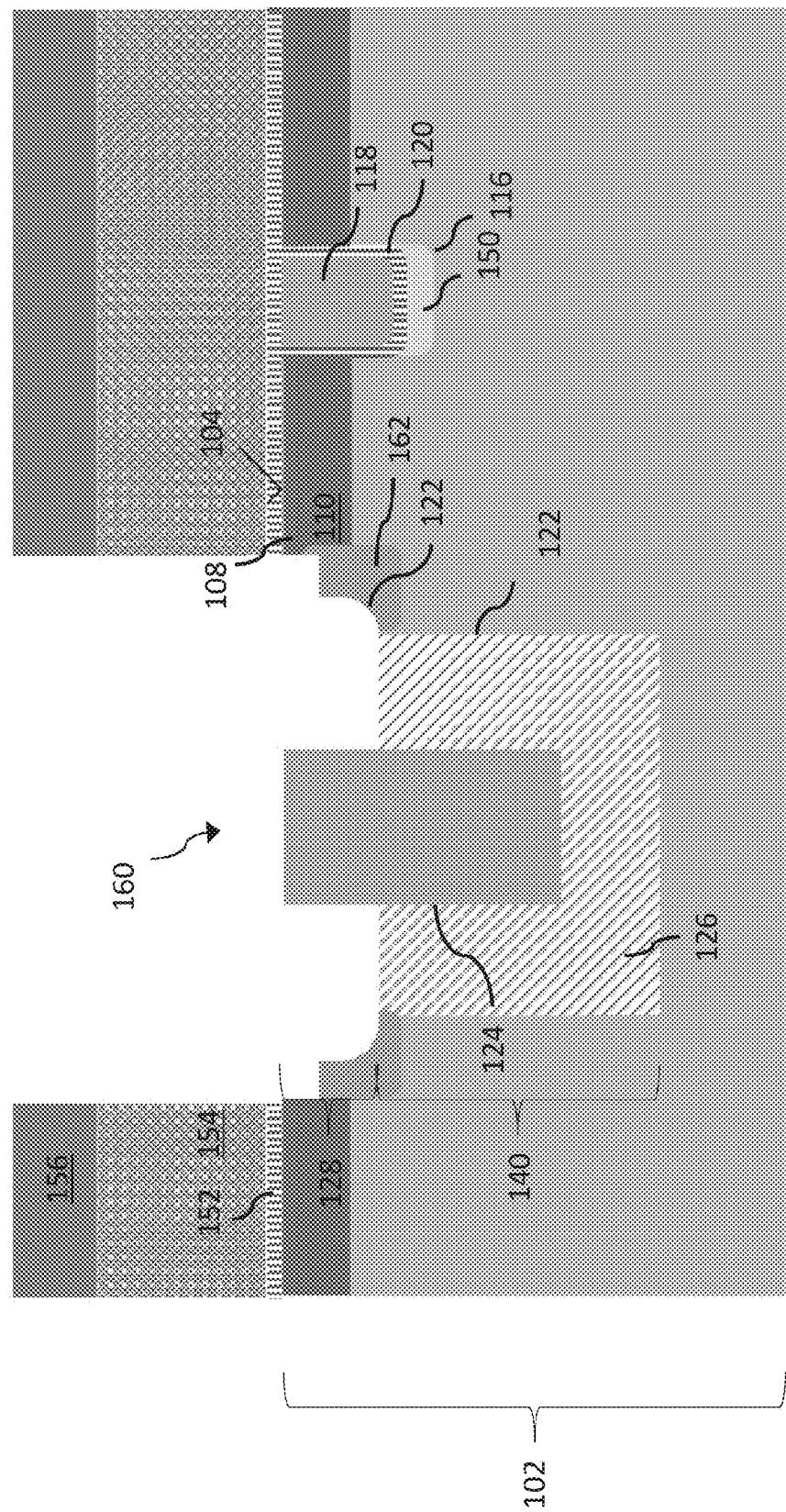
FIG. 19 illustrates removing exposed portions of the source regions in a method of forming the power semiconductor device, according to an embodiment.

Referring to FIG. 19, an optional process of removing semiconductor material from the corners of the field electrode trench 122 is shown. This can be done by etching the material of the substrate 102 selective to dielectric material using the previously described techniques. As a result, portions of the source region 108 that are exposed by the opening 160 are removed. This ensures that portions of the source region 108 that have been contaminated by opposite type dopants, and perhaps reversed in doping type, due to the doping process used to form the body extension regions 162.

After forming the body extension region 162 and, if desired, removing semiconductor material from the corners of the field electrode trench 122, an electrically conductive contact structure (e.g., a tungsten or polysilicon plug) can be formed in the opening. As a result, the field electrode 124 can be electrically connected to a terminal that is formed above the interlayer dielectric later, such as a source pad. Electrical connection to the gate electrode 118 can be effectuated using a similar or identical technique.

As used herein, the term "conformal" refers to a layer that conforms to the surface features of the item to which it is formed on. For example, an oxide layer that is formed by a deposition technique will grow with substantially equal thickness on any exposed surface (that is not resistant to oxide growth) and thus will conform to the geometry of the exposed surface.

As used herein, the term "approximately" means that the item conforms to the requirement insofar as process tolerances allow. For example, two trenches that have "approximately the same depth" have nomically the exact same depth, but may have slightly different depths in practice due to process variation.

As used herein, a "vertical direction" and corresponding directional descriptors such as "vertically extending" refer to a direction that is perpendicular to the main and rear surface s of the substrate. A "lateral direction" and corresponding directional descriptors such as "laterally extending" refer to a direction that is parallel the main and rear surface s of the substrate and perpendicular to the vertical direction.

The term "electrically connected" describes a permanent low-ohmic connection between electrically connected elements, for example a direct contact between the concerned elements or a low-ohmic connection via a conductive metal and/or highly doped semiconductor. By contrast, the term "electrically coupled" accounts for the possibility that one or more intervening element(s) adapted for signal transmission (e.g., transistors, diodes, etc.) may be provided between the electrically coupled elements.

In this specification, some figures illustrate relative doping concentrations by indicating "−" or "+" next to the conductivity type. For example, "$n^−$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^−$-doping and a $p^+$-doping region.

The device is illustrated and described an n-channel MOSFET for exemplary purposes only. A variety of different device types may be formed according to the techniques described herein. For example, the conductivity type of the body, source and drain regions may be reversed so that the device is a p-channel MOSFET. The device may be an enhancement mode or depletion mode device. The device is not necessarily a MOSFET, and may be implemented as any other another kind of active semiconductor device such as a diode, thyristor, IGBT, etc.

Spatially relative terms such as "under," "below," "lower," "over," "upper" and the like, are used for ease of description to explain the positioning of one element relative to a second element. These terms are intended to encompass different orientations of the device 100 100 in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, comprising:
    providing a semiconductor substrate comprising a main surface;
    simultaneously forming an upper portion of a field electrode trench and a gate trench in the main surface of the substrate to approximately the same depth;
    forming a first protective layer on the substrate, the first protective layer completely filling the gate trench and lining sidewalls of the upper portion of the field electrode trench, a bottom of the upper portion of the field electrode trench being exposed from the first protective layer;
    removing semiconductor material from the exposed bottom of the upper portion of the field electrode trench thereby forming a lower portion of the field electrode trench while the gate trench remains completely filled by the first protective layer;
    forming an electrically conductive field electrode and a field electrode dielectric in the upper and lower portions of the field electrode trench while the gate trench remains completely filled by the first protective layer;
    removing at least some of the first protective layer from the gate trench;
    forming a conformal gate dielectric layer that covers the field electrode and lines sidewalls of the gate trench after removing the at least some of the first protective layer; and
    forming an electrically conductive gate electrode in the gate trench while the field electrode remains covered by the gate dielectric layer.

2. The method of claim 1, wherein simultaneously forming an upper portion of a field electrode trench and the gate trench comprises:
    forming a first mask on the substrate, the first mask comprising first and second openings; and
    etching semiconductor material away simultaneously from sections of the substrate that are exposed by the first and second openings.

3. The method of claim 1, wherein forming the first protective layer comprises:
    forming a conformal first dielectric layer that lines the bottom and sidewalls of the upper portion of the field electrode trench and completely fills the gate trench; and
    etching a section of the first dielectric layer that lines the bottom of the upper portion of the field electrode trench.

4. The method of claim 3, wherein after etching the section of the first dielectric layer, the upper portion of the field electrode trench is wider than the lower portion of the field electrode trench, and the first protective layer remains on the sidewalls of the upper portion of the field electrode trench.

5. The method of claim 4, wherein forming the field electrode and the field electrode dielectric comprises:
    depositing a conformal field electrode dielectric layer on the substrate, the conformal field electrode dielectric layer covering the first protective layer in the upper portion and lining the sidewalls of the field electrode trench in the lower portion; and
    depositing a conformal electrically conductive field electrode layer on the substrate after depositing the field electrode dielectric layer such that a center of the field electrode trench is completely filled by the field electrode layer.

6. The method of claim 5, further comprising removing sections of the field electrode dielectric layer and the field electrode layer that are disposed outside of the field electrode trench thereby exposing the main surface.

7. The method of claim 4, further comprising, after forming the conformal gate dielectric layer:
    forming oppositely doped source and body regions in the substrate, the source region extending to the main surface and laterally extending between the field electrode trench and the gate trench, the body region being disposed beneath the source region and laterally extending between the field electrode trench and the gate trench.

8. The method of claim 7, further comprising, after forming the source and body regions:
    depositing an interlayer dielectric layer on the main surface, the interlayer dielectric layer covering the field electrode and the gate electrode.

9. The method of claim 8, further comprising:
    forming an opening in the interlayer dielectric layer over the field electrode trench, the opening exposing a top of the field electrode.

10. The method of claim 9, wherein forming the opening in the interlayer dielectric layer comprises removing a complete section of the interlayer dielectric layer that is disposed over the field electrode trench and completely removing the first protective layer from the upper portion of the field electrode trench.

11. The method of claim 10, further comprising, after forming the opening in the interlayer dielectric layer:
    introducing dopants into the opening thereby forming a body extension region that extends from the sidewalls of the upper portion of the field electrode trench into the substrate, the body extension region having the same conductivity type as the body region and connecting to the body region.

12. The method of claim 1, wherein removing at least some of the first protective layer from the gate trench comprises, after forming the electrically conductive field electrode and the field electrode dielectric:
    forming a second mask on the main surface, the second mask covering the field electrode and the field electrode dielectric and comprising an opening that exposes the gate trench; and
    etching the first protective layer away from the gate trench.

13. The method of claim 12, wherein the first protective layer is partially etched away from the gate trench such that a portion of the first protective layer remains at the bottom of the gate trench.

14. The method of claim 1, wherein the field electrode trench is formed to be to be wider than the gate trench, and wherein the gate trench is formed to be longer than the field electrode trench.

15. A method of forming a semiconductor device, comprising:
providing a semiconductor substrate comprising a main surface;
forming a field electrode trench comprising a dielectrically insulated field electrode and a gate trench comprising a dielectrically insulated gate electrode in the substrate, the field electrode trench being wider and deeper than the gate trench, the gate trench being longer than the field electrode trench, wherein forming the field electrode trench comprising the dielectrically insulated field electrode and the gate trench comprising a dielectrically insulated gate electrode comprises:
forming an upper portion of the field electrode trench and the gate trench simultaneously;
forming a first protective layer that completely fills the gate trench;
removing semiconductor material from a bottom of the upper portion of the field electrode trench thereby forming a lower portion of the field electrode trench while the gate trench remains completely filled by the first protective layer;
forming an electrically conductive field electrode and a field electrode dielectric in the upper and lower portions of the field electrode trench while the gate trench remains completely filled by the first protective layer;
removing at least some of the first protective layer from the gate trench;
covering the field electrode with a second protective layer; and
forming an electrically conductive gate electrode and a gate trench dielectric in the gate trench while the field electrode remains covered by the second protective layer.

16. The method of claim 15, wherein forming the upper portion of the field electrode trench and the gate trench simultaneously comprises:
forming a first mask on the substrate, the first mask comprising first and second openings; and
etching semiconductor material away simultaneously from sections of the substrate that are exposed by the first and second openings.

17. The method of claim 15, further comprising, after covering the field electrode with the second protective layer:
forming oppositely doped source and body regions in the substrate, the source region extending to the main surface and laterally extending between the field electrode trench and the gate trench, the body region being disposed beneath the source region and laterally extending between the field electrode trench and the gate trench.

18. The method of claim 17, further comprising, after forming the source and body regions:
depositing an interlayer dielectric layer on the main surface, the interlayer dielectric layer covering the field electrode and the gate electrode.

19. The method of claim 18, further comprising:
removing a removing a complete section of the interlayer dielectric layer that is disposed over the field electrode trench and removing all dielectric material from the upper portion of the field electrode trench thereby forming an opening that exposes a top of the field electrode; and
introducing dopants into the opening thereby forming a body extension region that extends from the sidewalls of the upper portion of the field electrode trench into the substrate, the body extension region having the same conductivity type as the body region and connecting to the body region.

20. The method of claim 19, further comprising removing portions of the source regions that are exposed by the opening.

* * * * *